United States Patent [19]

Stinson

[11] Patent Number: 5,417,767
[45] Date of Patent: May 23, 1995

[54] WAFER CARRIER

[76] Inventor: Mark G. Stinson, 1448 Ladd Ave., Woodriver, Ill. 62095

[21] Appl. No.: 174,046

[22] Filed: Dec. 28, 1993

[51] Int. Cl.⁶ .................. H01L 21/02; B05C 13/02
[52] U.S. Cl. .................. 118/728; 118/500; 206/454; 211/41
[58] Field of Search ............. 118/728, 729, 730, 731, 118/500; 211/41; 206/454

[56] References Cited

U.S. PATENT DOCUMENTS

| | | | |
|---|---|---|---|
| 4,355,974 | 10/1982 | Lee | 432/253 |
| 4,466,381 | 8/1984 | Jenkins | 118/728 |
| 4,548,159 | 10/1985 | Foster | 118/728 |
| 4,572,101 | 2/1986 | Lee | 118/500 |
| 4,586,743 | 5/1986 | Edwards | 294/86.4 |
| 4,676,008 | 6/1987 | Armstrong | 34/237 |
| 4,694,778 | 9/1987 | Learn | 118/728 |
| 4,920,920 | 5/1990 | Shigeki | 118/725 |
| 4,981,222 | 1/1991 | Lee | 211/41 |
| 5,054,418 | 10/1991 | Thompson | 118/500 |
| 5,292,393 | 3/1994 | Maydan | 156/345 |

FOREIGN PATENT DOCUMENTS 55-55518  4/1980  Japan .................. 118/728

Primary Examiner—R. Bruce Breneman
Assistant Examiner—Jeffrie R. Lund
Attorney, Agent, or Firm—Senniger, Powers, Leavitt & Roedel

[57] ABSTRACT

A wafer carrier which supports at least one wafer, during a process in which material is deposited on the wafer from chemical vapor in a reactor, includes a base having an inner curved surface extending from a first lateral edge of the base to a second lateral edge of the base. Slots in the inner surface of the base extending generally continuously from the first lateral edge to the second lateral edge are defined by a bottom wall and opposing side walls. The slots may each receive at least a portion of a thin, outwardly facing edge of the wafer for holding the wafer in an upright position. The bottom wall of the slot closely conforms to the predetermined shape of the portion of the outwardly facing peripheral edge of the wafer to inhibit the entry of vapor between the base and the outwardly facing edge of the wafer and the formation of material bridges between the wafer and the carrier by deposition of the material from the chemical vapor.

15 Claims, 3 Drawing Sheets

WAFER CARRIER

BACKGROUND OF THE INVENTION

This invention relates generally to carriers for holding articles during processing and more particularly to a carrier for holding wafers during chemical vapor deposition on the wafers.

It is common practice in the processing of semiconductor material (typically in the form of a wafer) to deposit a layer or film of polycrystalline semiconductor material on one face of the wafer. In the integrated circuit formed from the semiconductor wafer, the layer may provide conducting regions, electrical insulation between metals and/or protection from the environment. For example, a layer of polycrystalline silicon on a monocrystalline silicon may be used for gettering, or as the gate electrode material in MOS integrated circuit devices.

Although many methods are available for depositing a layer of material on the monocrystalline semiconductor wafer, chemical vapor deposition processes are most frequently employed. Generally, the wafer is held on a carrier in a heated reactor through which gas containing the material to be deposited in a vaporous form is circulated. The decomposition of the gas on the semiconductor wafer produces the layer. The most common process is referred to as low pressure chemical vapor deposition, or LPCVD.

As with all processing of semiconductor wafers, it is important that the wafer not be damaged during LPCVD. However, it has been found that wafers are occasionally chipped when removed from the carrier after the LPCVD because of the breakage of bridges of polycrystalline material which join the wafers to the carrier. The bridges are formed by polycrystalline material deposited from the gas onto the wafer and the carrier. A presently existing carrier used in LPCVD of polycrystalline silicon layers on silicon wafers supports and holds the wafers using four quartz rods held together by a frame. Small sections of the peripheral edges of the wafers are received in respective slots in of the rods, such that the wafers are held in an upright position. The wafers engage the rods only over small areas, amounting essentially to a point contact between the wafer and the rod. It is believed that the geometry of the rods and the slots permits the polycrystalline silicon vapor to access the points where the wafer engages the rods in the slots and build up substantial material bridges. The more material deposited in bridges connecting the wafer to the carrier, the more likely chipping of the wafer will occur when removed from the carrier.

SUMMARY OF THE INVENTION

Among the several objects and features of the present invention may be noted the provision of a wafer carrier which inhibits the formation of bridges of deposited material between the carrier and the wafer supported thereon; the provision of such a wafer carrier which isolates the contact points between the wafer and the carrier from access by gas containing material which can be deposited on the wafer; the provision of such a wafer carrier which is relatively inexpensive to manufacture and easy to use.

A wafer carrier constructed according to the principles of the present invention supports at least one wafer during processing of the wafer in which material is deposited on the wafer from chemical vapor in a reactor. The wafer has a thin, outwardly facing peripheral edge of a predetermined shape. Generally, the wafer carrier includes a base having an inner curved surface extending from a first lateral edge of the base to a second lateral edge of the base, and means for holding the base in an upright position. Slot means in the inner surface of the base extending generally continuously from the first lateral edge to the second lateral edge is defined by a bottom wall and opposing side walls. The slot means is adapted for receiving at least a portion of said outwardly facing edge of the wafer therein and for holding the wafer in an upright position. The bottom wall of the slot means closely conforms to the predetermined shape of the portion of the outwardly facing peripheral edge of the wafer such that the portion of the peripheral edge of the wafer is in face to face engagement with the bottom wall substantially along the entire length of the slot means. The carrier thus inhibits the entry of gas between the base and the outwardly facing edge of the wafer and the formation of material bridges between the wafer and the carrier by deposition of the material from the gas.

Other objects and features of the present invention will be in part apparent and in part pointed out hereinafter.

BRIEF DESCRIPTION OF THE DRAWINGS

Corresponding reference characters indicate corresponding parts throughout the several views of the drawings.

DETAILED DESCRIPTION OF THE PREFERRED EMBODIMENT

Figure 1:
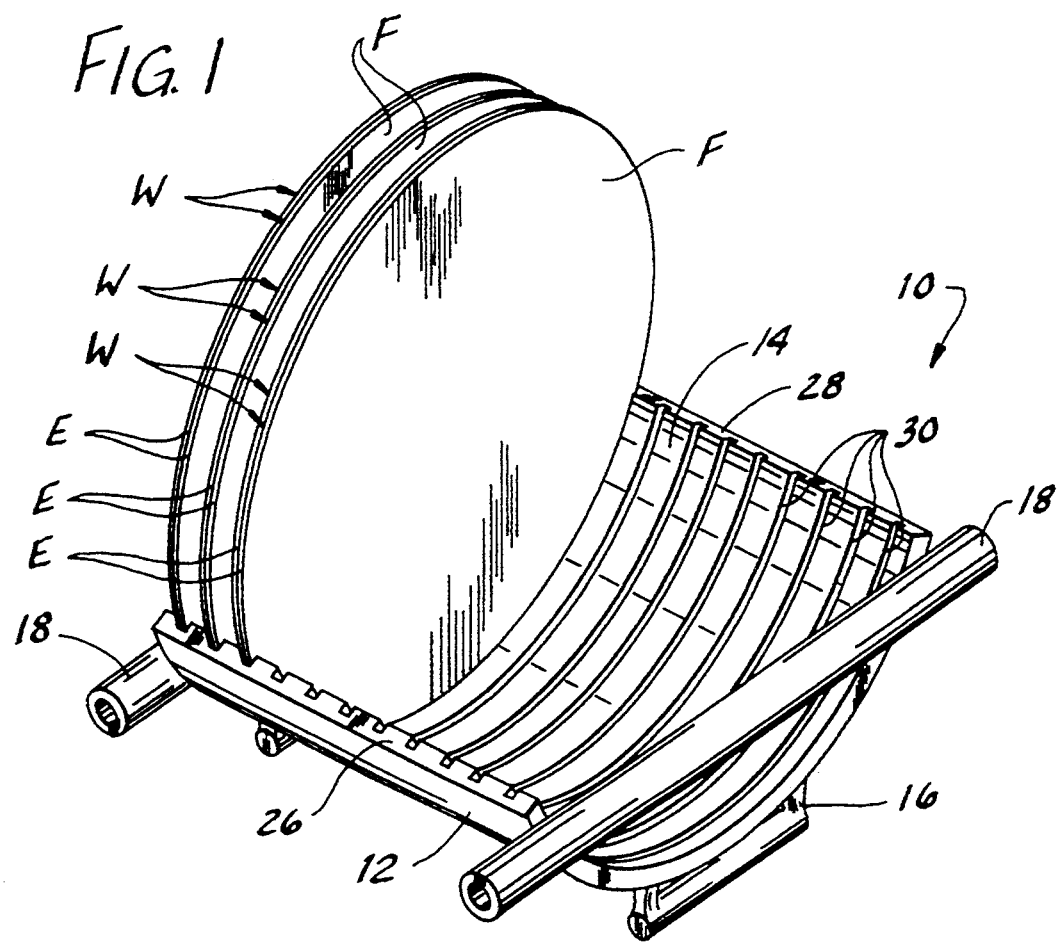
FIG. 1 is a perspective of the wafer carrier supporting some of the wafers showing wafers supported by the carrier.
Figure 2:
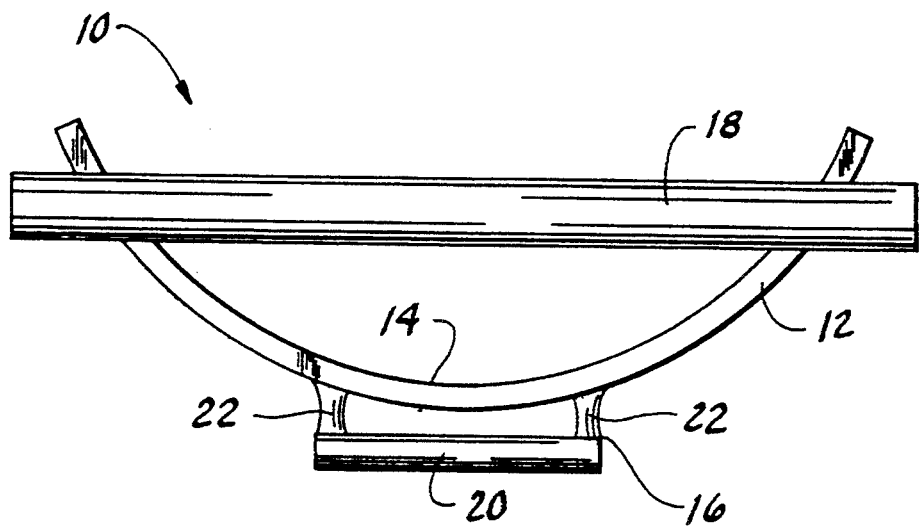
FIG. 2 is an end elevation thereof.
Figure 3:
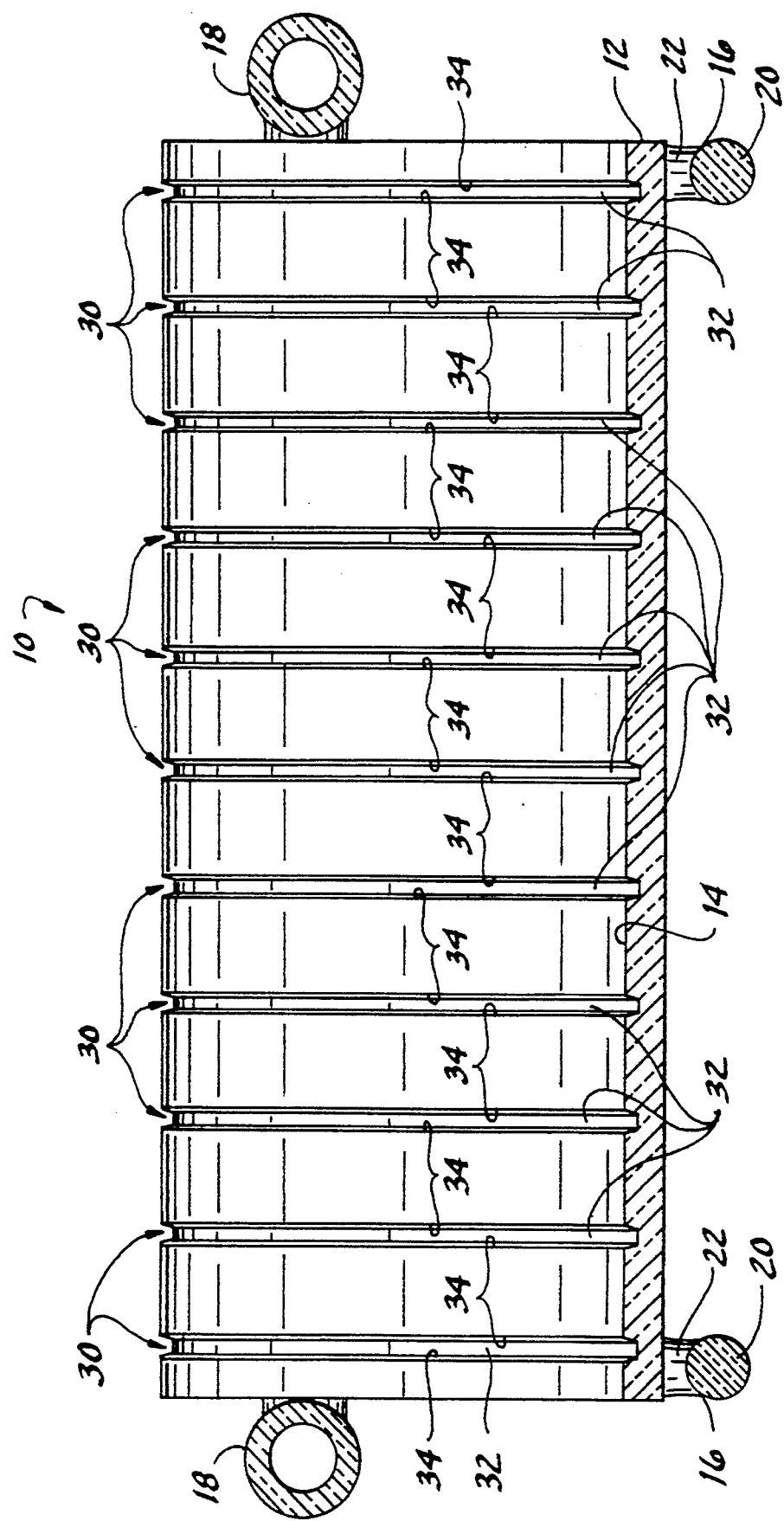
FIG. 3 is a longitudinal section of the wafer carrier along lines 3—3 of FIG. 1 with the wafers removed for clarity.

Referring now to the drawings, and in particular to FIG. 1, a wafer carrier, indicated generally at 10, is shown to comprise a base 12 having an inner curved surface 14, feet 16 depending from the base for holding it in an upright position and rods 18 at the front and rear ends of the base for use in holding and transporting the carrier. In the preferred embodiment, the base 12, feet 16 and rods 18 are all made of quartz and fused together. It is conceivable that the carrier could be made of a material other than quartz. Quartz is preferred because it will not contaminate the semi-conductor material during processing. The rods 18 are tubular and connected to respective ends of the base 12 where the rod intersects the arc of the base (FIG. 2). The feet 16 each include a solid, cylindrical bar 20 connected to the underside of the base by two short struts 22 joined to the bar 20 adjacent its ends.

The wafer carrier 10 is constructed for supporting at least one, but preferably a plurality of wafers W of semiconductor material. Each wafer W is generally circular in shape, having relatively large, flat opposite faces F and a thin, outwardly facing peripheral edge E extending circumferentially of the wafer. The wafer carrier 10 is particularly adapted, in processing of the wafers W, for holding the wafers as a polycrystalline silicon layer is deposited on the wafers such as by low pressure chemical vapor deposition (LPCVD) in a reactor (not shown). However, it is to be understood that the wafer carrier 10 may be used in other than LPCVD and still fall within the scope of the present invention.

Figure 5:
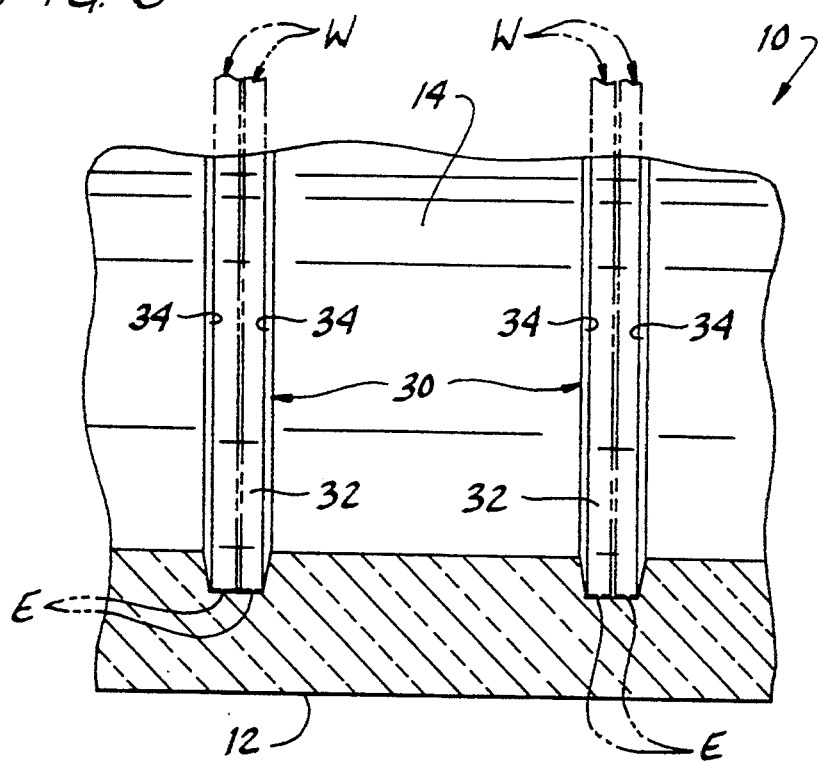
FIG. 5 is an enlarged fragmentary longitudinal section showing a single slot in the carrier.

The curved inner surface 14 of the base extends generally from a first lateral edge 26 of the base 12 to a second lateral edge 28. The inner surface 14 curves downwardly between the first and second lateral edges 26, 28 and has the shape of an arcuate segment of an interior wall of a hollow, circular cylinder. Slots, indicated generally at 30, in the inner surface 14 of the base are located at spaced intervals from front to rear of the base and extend laterally from the first lateral edge 26 to the second lateral edge 28 of the base. As shown in FIG. 5, each of the slots 30 is defined by a bottom wall 32 and a pair of opposing side walls 34, and is constructed to receive a portion of the outwardly facing peripheral edge E and adjacent edge margin of the faces F of one, or as shown in FIG. 1, two of the wafers.

Figure 4:
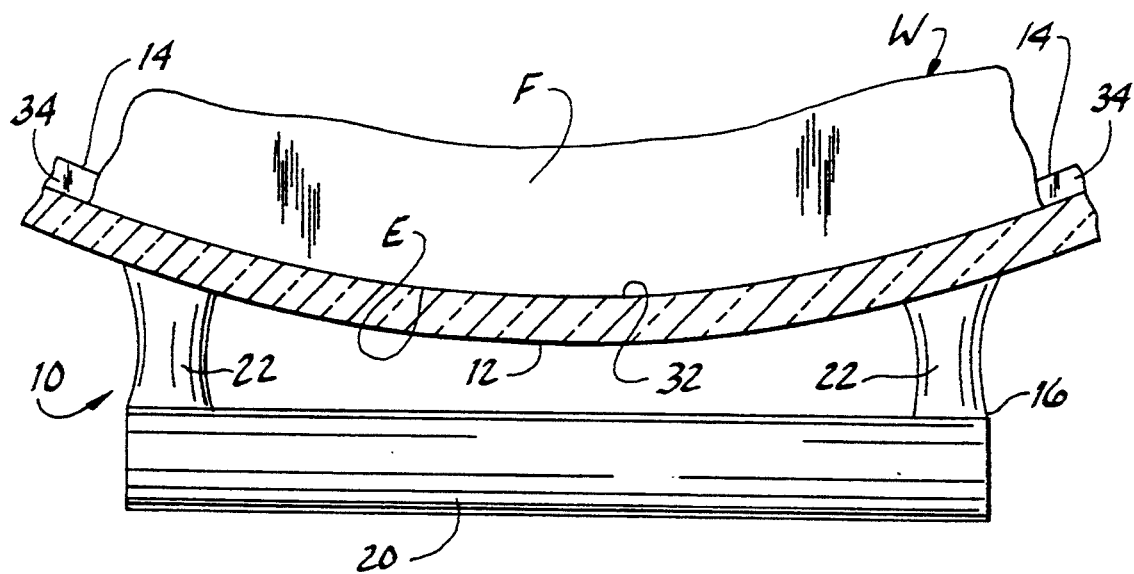
FIG. 4 is an enlarged fragmentary transverse section of the carrier illustrating the face to face engagement of the wafer with the bottom wall of the slot.

As shown in FIG. 4, the bottom wall 32 of each slot 30 closely conforms to the shape of the outwardly facing peripheral edge E of the wafers. In the illustrated embodiment, the radius of curvature of the bottom wall 32 is very nearly equal to the radius of the wafers W. A radius of curvature of the bottom wall 32 of approximately 103 mm for a wafer W having a radius of about 100 mm has been found to achieve satisfactory results. Thus, when a wafer W is placed in the slot 30 the portion of its outwardly facing peripheral edge E received in the slot engages the bottom wall 32 in face to face relation over substantially the entire length of the bottom wall, from end to end of the slot. The close similarity in the geometry of the bottom wall 32 and the outwardly facing peripheral edge E of the wafer provides no significant gap for admission of gas between the wafer W and the carrier 10 where they are in contact. Thus, the formation of bridges (not shown) consisting of semiconductor material deposited onto the wafer W and carrier 10 is greatly inhibited.

As shown in FIG. 5, the width of the slots 20 (i.e., the shortest distance between the side walls) is sized in close correspondence to the thickness of two the wafers W. Two wafers W in face to face relation may be set in the slot 30 and held in an upright position by engagement with the bottom wall 32 and side walls 34. The engaging faces of the wafers W prevent polycrystalline semiconductor material from being deposited on these faces. The slots may also have a width corresponding to the thickness of one wafer W so that each slot holds only a single wafer. Of course, a layer of semiconductor material will be deposited on both faces of the wafer in that instance. The side walls 34 contact the wafers W substantially continuously along their full lengths inhibiting seepage of gas between the side walls and wafer and the formation of polycrystalline semiconductor material bridges.

Use of the carrier 10 has been found to reduce the occurrence and severity of chipping of the wafer W. The close geometries of the slots 30 and the wafer peripheral edge E (and adjacent region of the wafer W) prevent deposition of substantial material at the points of contact between the carrier 10 and wafer. Further, it is believed that by supporting the wafers W along a substantial portion of its circumference (i.e., approximately over one-third of the circumference), rather than at relatively small points along its periphery, any bridges of polycrystalline material which are formed between the wafer W and the carrier 10 are relatively thin. The breakage of thin bridges when the wafer W is removed from the carrier 10 is not likely to cause chipping of the wafer.

In view of the above, it will be seen that the several objects of the invention are achieved and other advantageous results attained.

As various changes could be made in the above constructions without departing from the scope of the invention, it is intended that all matter contained in the above description or shown in the accompanying drawings shall be interpreted as illustrative and not in a limiting sense.

What is claimed is:

1. A wafer carrier for supporting at least one wafer during a process in which material is deposited on the wafer from chemical vapor in a reactor, the wafer having a thin, outwardly facing peripheral edge having a shape, the wafer carrier comprising a base having an inner curved surface extending from a first lateral edge of the base to a second lateral edge of the base, the inner curved surface of the base having the shape of an arcuate segment of an interior wall of a hollow, circular cylinder, means for holding the base in an upright position, and slot means in the inner surface of the base extending generally continuously from the first lateral edge to the second lateral edge and being defined by a bottom wall and opposing side walls, said slot means being sized and shaped for receiving at least a portion of said outwardly facing edge of the wafer therein and for holding the wafer in an upright position, the bottom wall of said slot means closely conforming to the shape of said portion of the outwardly facing peripheral edge of the wafer such that said portion of the peripheral edge of the wafer is in face to face engagement with the bottom wall substantially along the entire length of said slot means thereby inhibiting the entry of vapor between the base and the outwardly facing edge of the wafer and the formation of material bridges between the wafer and the carrier by deposition of the material from the vapor.

2. A wafer carrier as set forth in claim 1 wherein said slot means has a width between the side walls thereof which is sized in close correspondence to the thickness of the wafer.

3. A wafer carrier as set forth in claim 1 constructed for holding a plurality of wafers of substantially the same construction as said wafer, and wherein said slot means has a width between the side walls which is sized in close correspondence to the twice the thickness of said wafer whereby said slot means is sized and shaped to receive two wafers in face to face relation in the slot.

4. A wafer carrier as set forth in claim 1 wherein said slot means comprises a plurality of spaced apart slots in the inner curved surface of the base, each of the slots being of substantially the same construction.

5. A wafer carrier as set forth in claim 4 wherein each slot has a width between the side walls thereof which is sized in close correspondence to the thickness of the wafer.

6. A wafer carrier as set forth in claim 4 wherein the slots each have a width between the side walls which is sized in close correspondence to the twice the thickness of said wafer whereby each slot is sized and shaped to receive two wafers in face to face relation in the slot.

7. A wafer carrier as set forth in claim 1 wherein said slot means comprises a plurality of slots, each slot being constructed to hold at least one wafer therein independently of engagement by the wafer with any other portion of the wafer carrier.

8. In combination, a wafer and a wafer carrier for supporting the wafer during a process in which material is deposited on the wafer from chemical vapor in a reactor, the wafer having a thin, outwardly facing peripheral edge having a shape, the wafer carrier comprising a base having an inner curved surface extending from a first lateral edge of the base to a second lateral edge of the base, means for holding the base in an upright position, and slot means in the inner surface of the base extending generally continuously from the first lateral edge to the second lateral edge and being defined by a bottom wall and opposing side walls, said slot means being sized and shaped for receiving at least a portion of said outwardly facing edge of the wafer therein and for holding the wafer in an upright position, the bottom wall of said slot means closely conforming to the shape of said portion of the outwardly facing peripheral edge of the wafer such that said portion of the peripheral edge of the wafer is in face to face engagement with the bottom wall substantially along the entire length of said slot means thereby inhibiting the entry of vapor between the base and the outwardly facing edge of the wafer and the formation of material bridges between the wafer and the carrier by deposition of the material from the vapor.

9. The combination as set forth in claim 1I wherein the inner curved surface of the base has the shape of an arcuate segment of an interior wall of a hollow, circular cylinder.

10. The combination as set forth in claim 8 wherein said slot means has a width between the side walls thereof which is sized in close correspondence to the thickness of the wafer.

11. The combination as set forth in claim 8 further comprising a plurality of wafers of substantially the same construction, and wherein said slot means has a width between the side walls which is sized in close correspondence to the twice the thickness of the wafer whereby said slot means is sized and shaped for receiving two wafers in face to face relation in the slot.

12. The combination as set forth in claim 8 wherein said slot means comprises a plurality of spaced apart slots in the inner curved surface of the base, each of the slots being of substantially the same construction.

13. The combination as set forth in claim 13 wherein each slot has a width between the side walls thereof which is sized in close correspondence to the thickness of the wafer.

14. The combination as set forth in claim 13 wherein each slot has a width between the side walls thereof which is sized in close correspondence to the thickness of the wafer.

15. The combination as set forth in claim 13 further comprising a plurality of wafers having a substantially identical construction, and wherein the slots each have a width between the side walls which is sized in close correspondence to the twice the thickness of the wafer whereby the slot is capable of receiving two wafers in face to face relation in the slot.

* * * * *

UNITED STATES PATENT AND TRADEMARK OFFICE
CERTIFICATE OF CORRECTION

PATENT NO. : 5,417,767
DATED : May 23, 1995
INVENTOR(S) : Mark G. Stinson It is certified that error appears in the above-identified patent and that said Letters Patent is hereby corrected as shown below:

Column 6, claim 13, line 18, "13" should be ---12---; lines 20-22, "each slot has a width between the side walls thereof which is sized in close correspondence to the thickness of the wafer" should read ---the inner curved surface of the base has the shape of an arcuate segment of an interior wall of a hollow, circular cylinder---.

Signed and Sealed this

Ninth Day of January, 1996

Attest:

BRUCE LEHMAN

*Attesting Officer*  *Commissioner of Patents and Trademarks*